United States Patent [19]

Gardner

[11] Patent Number: 4,647,958
[45] Date of Patent: Mar. 3, 1987

[54] BIPOLAR TRANSISTOR CONSTRUCTION

[75] Inventor: Neal F. Gardner, Redondo Beach, Calif.

[73] Assignee: TRW Inc., Redondo Beach, Calif.

[21] Appl. No.: 710,352

[22] Filed: Mar. 11, 1985

Related U.S. Application Data

[63] Continuation-in-part of Ser. No. 600,707, Apr. 16, 1984, which is a continuation-in-part of Ser. No. 473,382, Mar. 8, 1983.

[51] Int. Cl.$^4$ .............................................. H01L 29/04
[52] U.S. Cl. ........................................ 357/59; 357/63
[58] Field of Search .............................. 357/59, 20, 63

[56] References Cited

U.S. PATENT DOCUMENTS

3,671,340  6/1972  Irie et al. ........................ 357/56 X
4,516,147  5/1985  Komatsu ............................ 357/59

Primary Examiner—Martin H. Edlow
Attorney, Agent, or Firm—Noel F. Heal; Robert J. Stern

[57] ABSTRACT

An improved bipolar transistor structure having an emitter region formed over a base region, and a thin wall of insulating material, such as a thermal oxide, along the edges of the emitter region. The wall of insulating material electrically isolates emitter and base contact area, and greatly reduces the size of inactive portions of the base region, thereby reducing the base resistance and base-collector capacitance, and increasing the speed of operation of the transistor. The emitter region comprises a first layer of arsenic-doped polycrystalline silicon (poly) and a second layer of phosphorous-doped semi-insulating polycrystalline silicon (SIPOS), to provide the best combination of desirable device characteristics.

6 Claims, 37 Drawing Figures

BIPOLAR TRANSISTOR CONSTRUCTION

CROSS-REFERENCES TO RELATED APPLICATIONS

This is a continuation-in-part of application Ser. No. 600,707, filed on Apr. 16, 1984, and having the same title, which was a continuation-in-part of application Ser. No. 473,382, filed on Mar. 8, 1983, also having the same title. This application is also related to another application by the same inventor, Ser. No. 600,709, filed on Apr. 16, 1984, and entitled "Barrier Emitter Transistor."

BACKGROUND OF THE INVENTION

This invention relates generally to techniques for the fabrication of integrated circuitry. More particularly, the invention relates to an improved construction for bipolar transistors in integrated circuits.

By way of general background, in bipolar transistors two types of current carriers, electrons and "holes," are involved in the conduction mechanism of the device. This is to be contrasted with unipolar devices, in which only a single carrier type is predominantly involved. A bipolar integrated circuit typically comprises many interconnected bipolar transistors, each of which is a three-terminal device having a base region, a collector region and an emitter region. There is one semiconductor junction between the base and emitter regions, and another junction between the base and collector regions. The collector and emitter regions of a transistor are doped with impurities that are of the same conductivity type, n-type or p-type, and the base region is of the opposite conductivity type. The transistor is then said to be of the n-p-n or the p-n-p type. The theory of operation of bipolar transistors is well known and will not be discussed in this specification.

In the fabrication of integrated circuits, many transistors are formed simultaneously, together with an isolation structure formed between adjacent transistors to prevent any unintended interaction between the devices. The isolation may, for example, take the form of a region of silicon dioxide, which is a conveniently available electrical insulator if the semiconductor materials comprise silicon. During the fabrication process, all of the base regions are formed in a single process step or related sequence of steps. Likewise, all of the emitter regions are formed in one step or series of steps, and there is typically a final metallization step in which electrical connections are made to the terminals of the transistors, by means of a patterned layer of metal formed over the circuit.

The formation of layers and patterned regions on an integrated circuit is effected by a variety of conventional process steps. Desired patterns are usually formed by means of photolithographic techniques, used in conjunction with patterned masks. The degree of precision with which the masks can be aligned with the circuit being fabricated typically limits the minimum feature geometry of the circuit. In a process having a number of such alignment steps, circuit features less than a few microns in width are difficult to achieve with consistency. It is therefore always desirable to reduce the number of photolithographic steps in the overall process, so that the complexity and cost of the technique can be minimized, and the circuits can be scaled down without affecting the yield of acceptable circuits resulting from the process.

In conventional bipolar transistor fabrication processes, at least two photolithographic operations are involved. The sequence of operations may vary from one process to another, but two photolithographic steps are almost invariably needed. Typically, one such step is employed to define the locations of emitter regions and the other is to define the locations of base contacts. A further photolithographic operation is usually required to define the areas of metallization over the circuit.

A significant limitation of conventional bipolar fabrication is the high-frequency performance of the resulting circuitry. It is well known that there are certain circuit parameters of bipolar transistors that affect the speed of operation and performance at high frequencies. Two of the most significant of these parameters are the base resistance and the base-collector capacitance. Reduction of either or both of these parameters results in improved speed and high-frequency performance.

For large-scale integrated circuitry, the usual design objectives, in addition to high speed, include high packing density and a simplified fabrication process. Many approaches have been used in an effort to reach these goals, but none appears to have been completely successful. There has therefore been a need for a bipolar transistor construction that provides transistors with improved high-speed performance, while at the same time simplifying the fabrication process and allowing substantially greater device packing densities.

The first-mentioned related application (Ser. No. 600,707) described a solution to this need, but still left room for improvement in the specific device structure.

More particularly, the transistor structure defined in the prior related application includes an emitter region formed to overlap a selected portion of a base region. A wall of insulating material is formed on the base region and adjacent to the edges of the emitter region, and serves to improve the high-speed performance of the device by reducing the length of an inactive base region, and therefore the base resistance. The emitter material in the prior application was described alternatively as semi-insulating polycrystalline silicon (SIPOS) or polycrystalline silicon (poly) appropriately doped to perform the emitter function. Both phosphorous-doped SIPOS and arsenic-doped poly material have separate significant disadvantages when optimum performance is desired from a transistor structure of the type described. Specifically, if phosphorous-doped SIPOS is used as the emitter material, the phosphorous diffuses from the emitter to the base region too rapidly to maintain a thin, heavily doped base region, which is needed for high-speed operation. Also, the use of phosphorous-doped SIPOS as an emitter material results in an irregular common emitter current gain in high-speed transistors.

The use of arsenic-doped poly as the emitter material avoids the problems arising from the use of phosphorous-doped SIPOS, but poses two new ones. First, the injection efficiency is much lower, and therefore the common emitter current gain and overall transistor performance are degraded. Also, there is a tendency for the emitter material to rupture at its periphery during the fabrication process. The injection efficiency is the ratio of the net majority-carrier current across the base-emitter junction to the net minority-carrier current across the same junction. If the injection efficiency is decreased, so is the common emitter current gain for the transistor.

Accordingly, there is a need for improvement in the selection of emitter materials for bipolar transistors for which high speed, packing density, or injection efficiency are considerations. The present invention satisfies this need.

SUMMARY OF THE INVENTION

The present invention resides in a bipolar transistor structure having an emitter region composed of two layers, a first layer of arsenic-doped polycrystalline silicon (poly) material and a second layer of phosphorous-doped semi-insulating polycrystalline silicon (SIPOS) material. In the preferred embodiment of the invention, the first layer is only about one-sixth of the thickness of the second layer, the approximate thicknesses being 400 Å (angstroms) and 2,500 Å.

The use of arsenic-doped poly in contact with the base region of the structure tends to inhibit the diffusion of phosphorous from the SIPOS layer, and also tends to minimize any irregularity in the common emitter current gain. Injection efficiency is only slightly degraded by the use of the thin first poly layer. The SIPOS layer apparently acts as a stress relieving layer and inhibits rupturing of the emitter during fabrication.

It will be appreciated from the foregoing that the present invention represents a significant advance in the field of bipolar transistor structures for which high speed, high packing density, or high injection efficiency are important considerations. Other aspects and advantages of the invention will become apparent from the following more detailed description of an exemplary structure, taken in conjunction with the accompanying drawings.

DESCRIPTION OF THE PREFERRED EMBODIMENT

The present invention is concerned with an improvement in bipolar transistor structures intended for high speed of operation. Bipolar transistor circuits are inherently limited in their speed of operation, and therefore in their usefulness in high-frequency applications. In accordance with principles described in a prior cross-referenced application, Ser. No. 600,707, the speed of operation of bipolar transistors can be greatly increased. The structures described and claimed in the cross-reference applications are also described here, before focusing on a detailed description of the present invention.

Figure 1A:
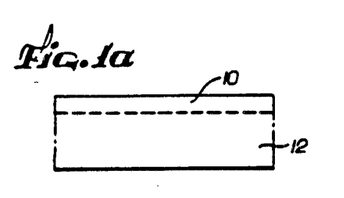
FIGS. 1a–1i are a sequence of sectional views showing the processing steps for fabrication of a bipolar transistor structure in which the present invention may be included.

As shown in FIG. 1a, the transistor structure with which the invention is concerned is fabricated by first forming a semiconductor base layer, indicated by reference numeral 10, in a semiconductor material that will serve as the collector region 12 of the device. As is conventional, the base layer and collector region are of opposite conductivity types. For example, if the collector is of n-type material the base layer will be of p-type material. The semiconductor material used is not critical to the invention in its broadest sense. It could, for example, be silicon doped with a suitable impurity to provide the desired conductivity type. Furthermore, the base layer 10 could be formed by any conventional technique, such as ion implantation.

The collector 12 may be of any type conventionally used for bipolar processing, such as a lightly doped epitaxial material on a heavily doped buried layer. Moreover, the collector 12 may be one of a number of collector regions on a single semiconductor wafer, separated by any conventional isolation technique, such as diffused isolation.

Figure 1B:
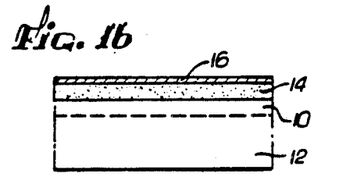

The next step in the process is to form an emitter layer 14 over the base layer 10, as shown in FIG. 1b. The emitter layer 14 has the same conductivity type as the collector region 12, and may be formed by any conventional process, such as diffusion, ion implantation, epitaxial deposition, or polysilicon deposition. Furthermore, the emitter material may be different from that of the collector and base. For example, polysilicon or semi-insulating polysilicon (SIPOS) may be used over a silicon substrate. As described later, the selection of specific emitter materials is critical to the present invention. As also shown in FIG. 1b, a film 16 is deposited over the emitter layer 14. The film 16, which is used later for oxidation masking, may be silicon nitride ($Si_3N_4$), if silicon materials are used, formed by chemical vapor deposition. The purpose of the film is to provide a mask for a subsequent oxidation step.

Figure 1C:
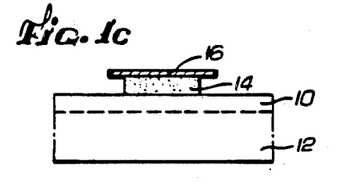

In the next step, shown in FIG. 1c, the film 16 is patterned and etched to define an emitter region of the transistor. Then the emitter layer itself is also etched, and the film is undercut by a controlled amount. This leaves the film extending over the edge of the remaining emitter region by a small distance. The patterning and etching of the emitter region may be performed by conventional photoresist techniques and selective etching. It is desirable that the etched away portions of the emitter layer 14 are completely removed, but that none of the underlying base layer is removed. This can be a difficult goal to achieve without the use of a thin additional layer (not shown) formed between the base 10 and the emitter layer 14. The thin additional layer can be an oxide, for example, which will facilitate etching of the emitter layer right down to the base region 10.

The step of etching the emiter layer 14, and undercutting the silicon nitride film 16 as shown in FIG. 1c, can be further facilitated by the use of another thin oxide layer formed between the emitter 14 and film 16. After the film 16 is patterned and etched, this oxide layer is etched and undercut with an etchant that does not react with the emitter material. The undercutting of this oxide layer exposes the upper surface of the emitter material 14 in the undercut areas beneath the edges of the film 16. When the emitter 14 is etched, a desired degree of undercut is obtained without prolonged exposure to the etchant, and there is less risk of damage to the base region 10.

Figure 1D:
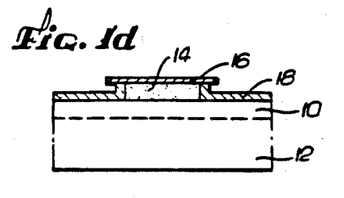
Figure 1E:
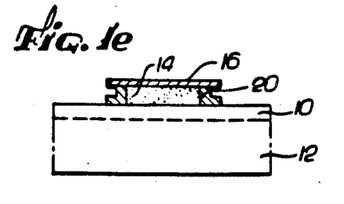
Figure 1F:
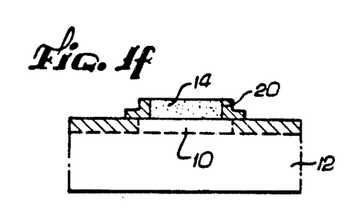

In the next step, shown in FIG. 1d, a thermal oxide layer 18 is formed on the semiconductor surfaces but not on the masking film 16. Then, as shown in FIG. 1e, the oxide layer is etched away with a directionally preferential technique, in a direction normal to the planar surface of the oxide layer. The directionally preferential technique may be, for example, sputter etching or plasma assisted chemical vapor etching. The film 16 acts as a mask in the preferential etching process, and a sidewall 20 of the insulating oxide material remains adjacent to the edge of the emitter region 14. Next, the remaining portion of the masking film 16 is removed by etching, and portions of the base layer 10 not beneath the emitter may be further doped to reduce their resistance. These portions are referred to as the inactive base regions. This doping may be accomplished by a technique such as ion implantation, with the emitter material acting as an implantation mask for every part of the base but the inactive base.

Figure 1G:
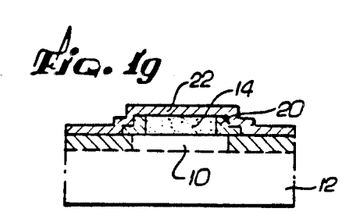

The remaining steps of the process are conventional. A metal film 22 is deposited over the entire structure, as shown in FIG. 1g, including the emitter region 14 and the inactive portions of the base 10. Basically, the metal film must have three properties. It must be able to be sintered to semiconductor materials to form a low-resistivity film. It must not sinter to the insulating region, i.e., the sidewall 20, separating the emitter from the base. Finally, there must be an etching solution that will remove the unsintered metal and leave the sintered metal intact. Platinum is an example of such a metal for use in silicon technology. Platinum sinters to silicon to form platinum silicide, but not to silicon dioxide or silicon nitride. Unsintered platinum can be etched by boiling aqua regia, without attacking platinum silicide.

Figure 1H:
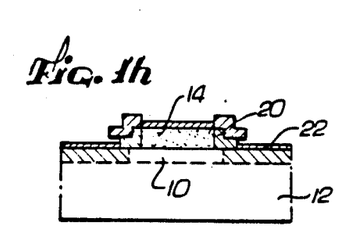
Figure 1I:
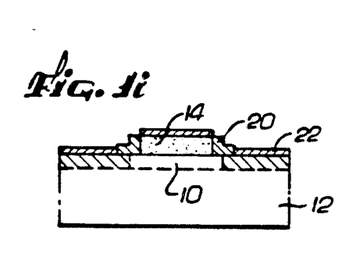
Figure 2A:
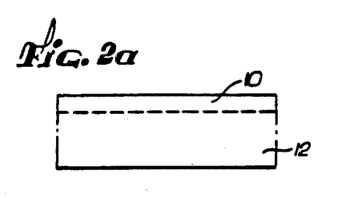
FIGS. 2a–2i are a sequence of sectional views showing the processing steps for fabrication of an alternative structure.
Figure 2B:
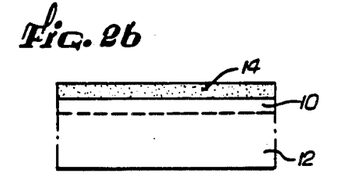
Figure 2C:
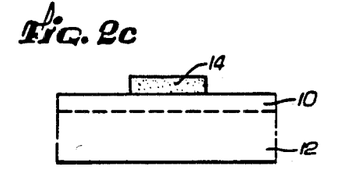
Figure 2D:
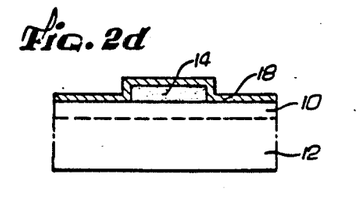
Figure 2E:
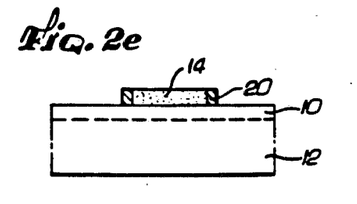
Figure 2F:
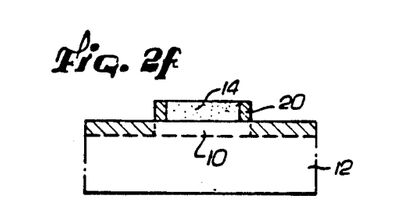
Figure 2G:
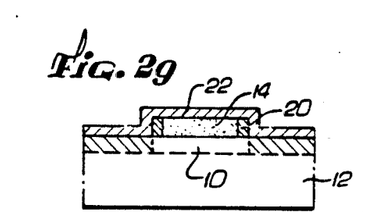
Figure 2H:
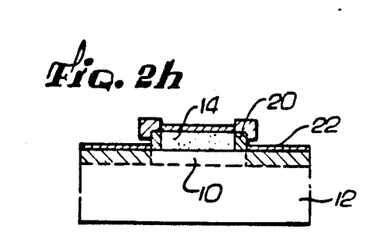
Figure 2I:
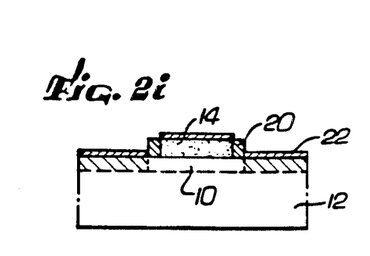

In FIG. 1h, the sintering step has been completed, leaving the sintered metal film over the base 10 and over the emitter region 14, and unsintered metal film over the sidewall 20. In FIG. 1i, the unsintered metal has been etched away to expose the insulating wall 20, which then serves to isolate base and emitter electrical connections. In a final step, which is conventional and not shown, a metallization layer is added to the device, to establish electrical connections to the emitter and base regions.

The thin sidewall 20 of insulating material may be only 0.2 to 0.5 micron in thickness, measured in a direction parallel to the base region surface. This is to be compared with a corresponding dimension of approximately five to six microns in a conventionally fabricated bipolar transistor. This dimension of the base region is basically in the direction of current-carrier flow. Any reduction of the length of the inactive base region is reflected directly in a corresponding decrease in the base resistance of the transistor, and in a decrease in the base-collector capacitance. Since both base resistance and base-collector capacitance directly affect the speed of operation of the transistor, the effect of the approach described is to increase the speed of operation.

The reduction in overall size of the base region also means that the entire transistor occupies a significantly smaller area on a semiconductor wafer, and the device packing density may be accordingly increased. Increases in packing density are usually accompanied by increases in the complexity of the fabrication process, or at least by a diminished yield of acceptable circuits. However, use of the technique described actually simplifies the fabrication process, since only one photolithographic operation is required to define both the emitter region and the base contact areas. In conventional processes, at least two photolithographic operations are needed for these purposes.

An alternative to the process of FIG. 1 is illustrated in FIG. 2. As in the first-described embodiment, a base region 10 is formed over a collector region 12, as shown in FIG. 2a. Then the emitter layer 14 is formed (FIG. 2b), but no nitride or other film is deposited over it. Instead, the emitter layer is patterned and etched to define the emitter region position, as shown in FIG. 2c. Then an insulating layer 18, such as an oxide is formed over the entire device, including the base 10 and the emitter region 14, as shown in FIG. 2d. FIG. 2e shows the device after a directionally preferential etching step has removed all of the insulating layer 18 except for the sidewall 20. Once again, the inactive base regions may be more heavily doped at this stage to decrease the base resistance, as indicated in FIG. 2f. The remaining steps are identical with the ones illustrated in FIGS. 1g-1i.

A conventional bipolar fabrication process is shown in FIG. 3, and may be conveniently compared with FIG. 4, which shows the process of FIG. 3 may be improved. In the conventional process, silicon dioxide wells 30 are formed to surround an n-type epitaxial material 32 that will serve as a collector region of a bipolar transistor. First, a silicon nitride film 34 is deposited over the n-type material, as shown in FIG. 3b, and the nitride layer is patterned and etched to define the locations of the base contact regions and an emitter region. The nitride film 34 is etched to provide two openings 36 between the oxide wells 30.

Figure 3A:
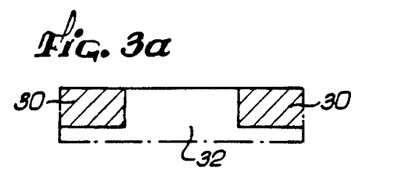
FIGS. 3a–3h are a sequence of sectional views showing the steps of a conventional bipolar fabrication process.
Figure 3B:
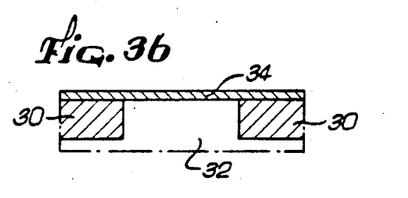
Figure 3C:
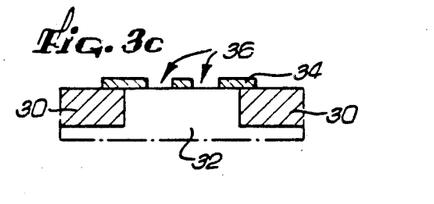
Figure 3D:
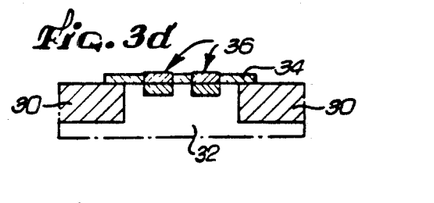
Figure 3E:
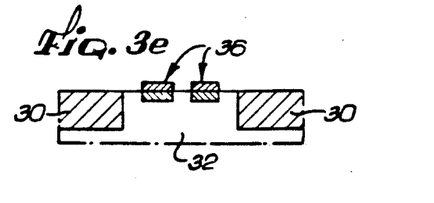
Figure 3F:
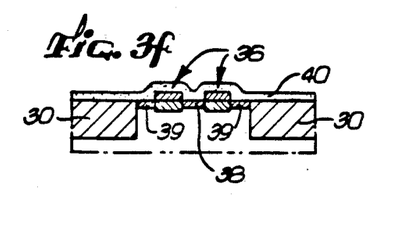
Figure 3G:
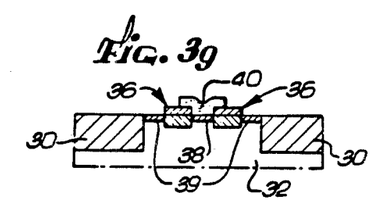
Figure 3H:
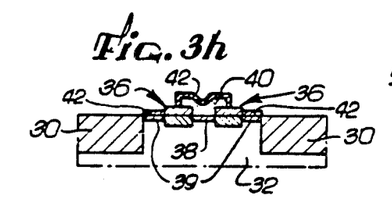
Figure 3I:
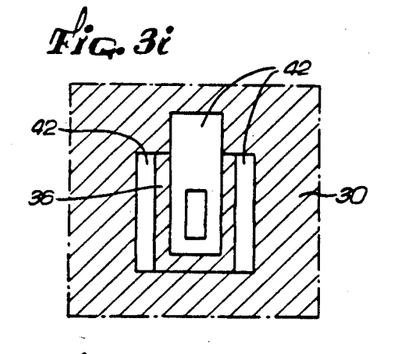
Figure 3J:
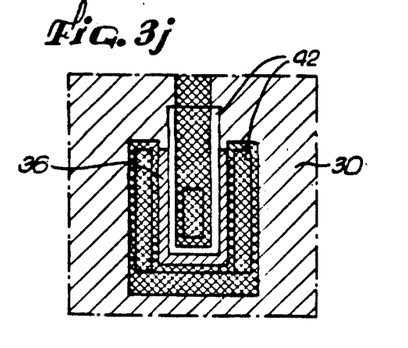

Inactive base regions are formed beneath the openings 36, by diffusion into the n-type material, and oxide is formed over the openings, as shown in FIG. 3d. The nitride film is then stripped, as shown in FIG. 3, and active base regions and a base contact are implanted in the areas indicated at 38 and 39, respectively, in FIG. 3f. A layer 40 of polysilicon or SIPOS (semi-insulating polysilicon) is deposited over the entire device, and is next patterned to define the emitter of the device, as indicated in FIG. 3g. The SIPOS emitter is then annealed, or the polysilicon emitter material is diffused. It will be noted that two photolithographic operations are required to reach this point in the process. One is to define the base contact and emitter regions, and the second defines the emitter contact area. The inactive ase regions have to be relatively wide to allow for any alignment errors in the two patterning operations and still provide for reliable electrical isolation of the emitter and base. In FIG. 3h, platinum 42 has been deposited over the device, then sintered and etched to remove the unsintered metal overlying the oxide areas. FIGS. 3i and 3j show the device in plan view before and after a metallization step has been performed.

Figure 4A:
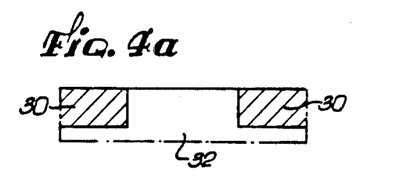
FIGS. 4a–4e are a sequence of sectional views showing how the processing steps of FIGS. 3a–3h may be modified in accordance with an alternative process to those of FIGS. 1 and 2.
Figure 4B:
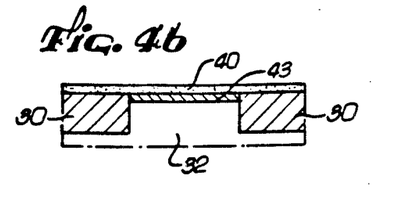
Figure 4C:
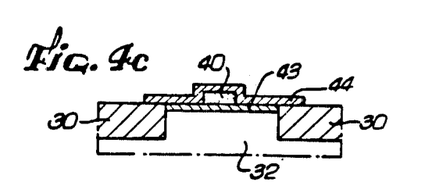
Figure 4D:
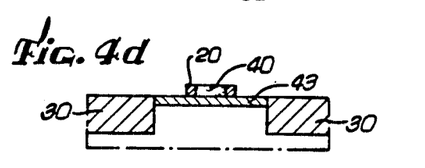
Figure 4E:
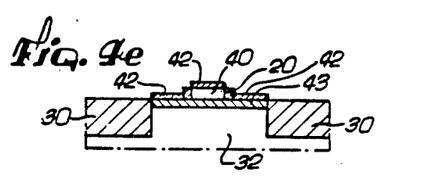
Figure 4F:
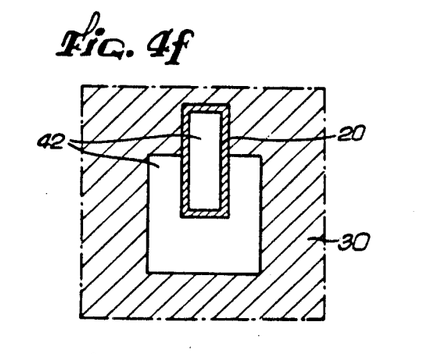
FIGS. 4f and 4g are plan views of the device fabricated by the steps shown in FIGS. 4a–4e, before and after a metallization step, which is not shown.
Figure 4G:
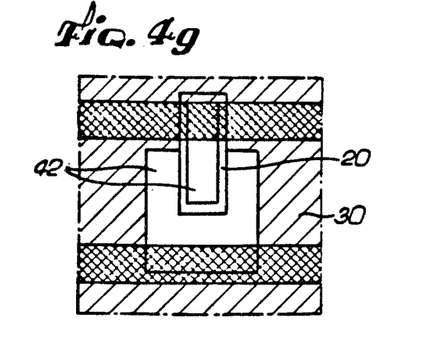

By way of contrast, the improved process is shown in FIGS. 4a–4g. Steps shown in FIGS. 3b–3e are completely eliminated in the improved process. In the step shown in FIG. 4b, an active base layer 43 is implanted over the entire surface of the n-type collector material 32, and a polysilicon or SIPOS layer 40 is deposited. As shown in FIG. 4c, the layer 40 is patterned and etched to define the emitter region, and there is the conventional step of annealing the SIPOS or diffusing the polysilicon. Then, the entire device is covered with an oxide layer 44, most of which is subsequently removed in a directionally preferential etching step, to leave the insulating sidewall 20 at the edges of the emitter region 40, as shown in FIG. 4d. The steps next performed, to reach the structure shown in FIG. 4e, are the same as those performed in the conventional process. A metal film is deposited over the base contact and emitter regions, and is selectively sintered onto the semiconductor surfaces. The unsintered metal overlying the insulating sidewall is removed by etching, and the device is then ready for the final metallization step. FIGS. 4f and 4g are plan views of the device before and after metallization.

It will be apparent from FIGS. 3 and 4 that the process of FIG. 4 differs from the corresponding conventional processes in that a complex sequence of steps is omitted (FIGS. 3b–3e), and two additional steps are included, namely an oxidation step after the emitter region has been patterned and etched, and a directionally preferential etching step (FIG. 3d). FIG. 4 uses the sequence of steps shown in FIG. 2. It will be understood that the preferred sequence of FIG. 1 could also be used to modify the conventional process shown in FIG. 3.

The structure described above operates satisfactorily in most respects, and has the important advantage of providing a relatively long active emitter perimeter, and therefore a relatively low base resistance. However, the described embodiment does suffer from one significant drawback. The emitter resistance, as measured between the emitter contact metallization and the emitter-base junction, is too high for some applications of the device. The emitter region 40 is too small to be covered with a conventional metallization layer, such as aluminum. The platinum silicide layer applied over the emitter region to keep the resistance reasonably low still has a sheet resistance that is too high for some applications.

Figure 5:
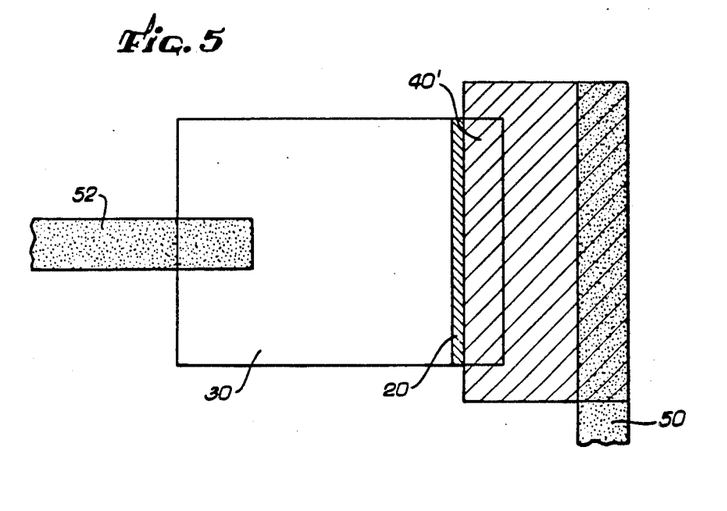
FIG. 5 is a plan view of the device modified to have a relatively wide emitter region, to reduce emitter resistance.

One way of overcoming this difficulty would be to make the entire emitter region much wider, as shown at 40' in FIG. 5. This would also facilitate contact with an emitter contact metallization strip 50. The corresponding base contact metallization strip is indicated at 52. Unfortunately, however, the area of overlap with the base region 30 is then quite critical. If the overlap area is too small, the emitter current density will be excessive, thereby causing an effect known as base pushout or the Kirk effect. This results in an increase in the base transit time, and degrades transistor performance. If the overlap between the emitter and base regions is too large, the base resistance becomes too large and device performance is also degraded.

Figure 6:
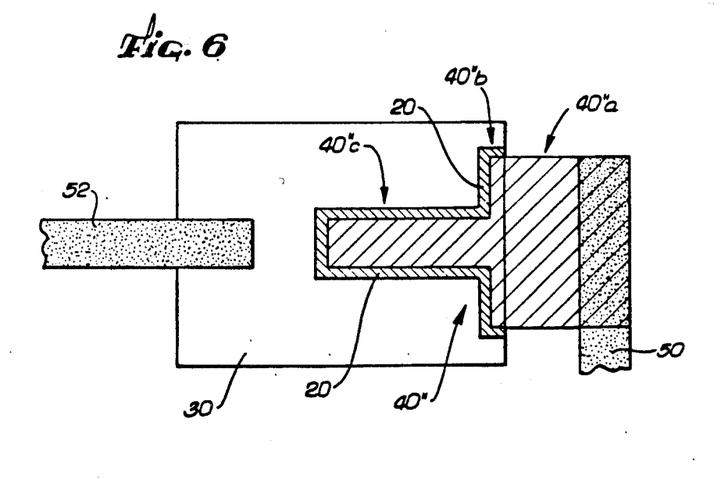
FIG. 6 is a plan view of a preferred form of the device, modified to have an emitter region that provides reduced emitter resistance without any significant effect on base reisistance.

In another embodiment of the device, the emitter region, indicated at 40'', is shaped as shown in FIG. 6, to provide a combination of the advantages of the configurations of FIGS. 4g and 5. The emitter region 40'' has a wide inactive portion 40''a, which facilitates emitter contact metallization, and an adjoining active portion that has a first area 40''b as wide as the inactive region, and a second narrower area 40''c. The first, wide area 40''b ensures a relatively low emitter resistance, and together with the second area 40''c, provides a relatively long active emitter perimeter, thereby ensuring a relatively low base resistance. Thus the long active emitter perimeter and correspondingly low base resistance of the embodiment of FIG. 4g are retained. In addition, however, the low emitter resistance that is characteristic of the FIG. 5 embodiment is also obtained in the embodiment of FIG. 6.

Although the methods and structures described to this point are satisfactory for many applications, they leave room for improvement in one important respect, namely the choice of emitter material. The choice of emitter material can play an important role in the optimum characteristics of the device. If phosphorous-doped semi-insulating polycrystalline silicon (SIPOS) is used, two problems are encountered. First, the phosphorous diffuses into the base region at such a rapid rate that it is difficult to maintain a thin, heavily doped base, which is desirable for high-speed operation of the transistor structure. Second, the common emitter current gain of transistors fabricated in this manner is very irregular.

Both of these problems encountered with the use of phosphorous-doped SIPOS can be virtually eliminated by the use arsenic-doped polycrystalline silicon (poly) material for the emitter. However, two new problems are presented by the use of arsenic-doped poly. First, the injection efficiency is much lower than for phosphorous-doped SIPOS emitters. This results in a significant reduction in the common emitter current gain and hence a degradation in transistor performance. The second problem is that there is a tendency for the arsenic-doped poly to rupture around the emitter periphery during the fabrication process. This results in the formation of emitter-base short-circuits, and a consequent degradation of performance.

In accordance with the invention, the emitter is formed as two separate layers: a first layer of approximately 400 Å of arsenic-doped poly in contact with the base, and a second layer of approximately 2,500 Å of phosphorous-doped SIPOS formed over the first layer. Rapid diffusion of phosphorous into the base is believed to be caused by the phosphorous itself inducing stress in the silicon, which expedites the diffusion process. Arsenic is believed to reduce this stress, and to thereby reduce this stress-enhanced diffusion effect. In any event, the intervening layer of arsenic-doped poly substantially reduces the diffusion of phosphorous into the base region.

The irregular common-emitter current gain observed when SIPOS emitters are used is believed to be due to stacking faults resulting from oxidation of the base around the periphery of the emitter. The stacking faults are formed because of residual implant damage in the base. Since arsenic has a lower tendency than phosphorous to diffuse through these damaged regions of the base, transistors having arsenic-doped poly emitters exhibit less iregularity in their common emitter current gain.

The effect of arsenic-doped poly on injection efficiency is minimized by the thin cross section of the arsensic-doped layer. The rupturing of the emitter when arsenic-doped poly is used is believed to be stress induced by the deposition of silicon nitride over the emitter. This is a well known problem associated with the use of silicon nitride. The problem is usually solved by forming a stress-relieving layer of silicon dioxide beneath the silicon nitride. The phosphorous-doped SIPOS apparently behaves in the same manner as a stress-reducing oxide layer. Thus the phosphorous-doped layer functions both as a stress reliever to avoid rupturing of the emitter periphery, and as an injection efficiency enhancer. This enhancement of injection efficiency is consistent with the disclosure of the inventor's copending application Ser. No. 600,709, entitled "Barrier Emitter Transistor."

It will be appreciated from the foregoing that the present invention represents a significant improvement in bipolar transistors employed for high-speed operation, or in which packing density or injection efficiency are important considerations. It will also be appreciated that, although a specific embodiment of the invention has been described in detail for purposes of illustration, various modifications may be made without departing from the spirit and scope of the invention. Accordingly, the invention is not to be limited except as by the appended claims.

I claim:

1. A bipolar transistor construction, comprising:
    a collector region of n type silicon semiconductor material;
    a base region of p type silicon semiconductor material formed over the collector region;
    an emitter region of n type semiconductor material formed to overlap a selected mid-portion of the base region, the emitter region being formed as two separate layers, of which the first is of arsenic-doped polycrystalline to inhibit rapid diffusion of dopants out of the emitter structure and maintain a stable common emitter current gain and the second is of phosphorous-doped semi-insulating polycrystaline silicon (SIPOS) to inhibit peripheral rupturing of the emitter and enhance the injection efficiency of the transistor.

2. A bipolar transistor construction as set forth in claim 1, in which:
    the first layer is approximately 400 angstroms thick and the second layer is approximately 2,500 angstroms thick.

3. A bipolar transistor construction as set forth in claim 1, and further including:
    a wall of insulating material formed on the base region in contact with the edges of the emitter region and having a height approximately equal to the thickness of the emitter region; and
    a conductive layer formed over the base region and the emitter region but not over the wall of silicon dioxide insulating material, the conductive layer serving to establish separate connections to the base region and the emitter region;
    whereby the wall of insulating material electrically isolates separate connections to the base and emitter regions and reduces the size of inactive portions of the base region, thereby decreasing base resistance and base-collector capacitance, and increasing speed and device packing density.

4. A bipolar transistor construction as set forth in claim 3, in which:
    the emitter region has a relatively wide inactive portion, not overlapping the base region, and an adjoining active portion with a first area that is of substantially the same width as the inactive portion, to provide a relatively low emitter resistance, and a contiguous second area that is narrower than the first area and provides a relatively long active emitter perimeter and therefore a relatively low base resistance.

5. For use in a bipolar transistor intended for use at high speeds or frequencies, an emitter structure comprising;
    a first layer of arsenic-doped polycrystalline silicon (poly) formed in contact with a base layer of the transistor to inhibit rapid diffusion of dopants out of the emitter structure and maintain a stable common emitter current gain; and
    a second layer of phosphorous-doped semi-insulating polycrystalline silicon (SIPOS) formed over the first layer to inhibit peripheral rupturing of the emitter and enhance injection efficiency of the transistor.

6. An emitter structure as set forth in claim 5, in which:
    the first layer has a thickness of approximately 400 angstroms; and
    the second layer has a thickness of approximately 2,500 angstroms.

* * * * *